United States Patent
Shen et al.

(10) Patent No.: US 10,374,753 B2
(45) Date of Patent: Aug. 6, 2019

(54) POLAR CODE RATE MATCHING METHOD AND POLAR CODE RATE MATCHING APPARATUS

(71) Applicant: Huawei Technologies Co., Ltd., Shenzhen, Guangdong (CN)

(72) Inventors: Hui Shen, Shenzhen (CN); Bin Li, Shenzhen (CN); Jun Chen, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 115 days.

(21) Appl. No.: 15/274,188

(22) Filed: Sep. 23, 2016

(65) Prior Publication Data
US 2017/0012740 A1    Jan. 12, 2017

Related U.S. Application Data

(63) Continuation of application No. PCT/CN2014/073918, filed on Mar. 24, 2014.

(51) Int. Cl.
*H04L 1/00* (2006.01)
*H04L 1/18* (2006.01)
(Continued)

(52) U.S. Cl.
CPC .......... *H04L 1/0067* (2013.01); *H03M 13/13* (2013.01); *H03M 13/2757* (2013.01);
(Continued)

(58) Field of Classification Search
CPC ... H04L 1/0067; H04L 1/0057; H04L 1/0071; H04L 1/0041; H04L 1/00; H03M 13/13;
(Continued)

(56) References Cited

U.S. PATENT DOCUMENTS

| 2004/0170232 A1 | 9/2004 | Ha et al. |
| 2006/0156199 A1 | 7/2006 | Palanki et al. |

(Continued)

FOREIGN PATENT DOCUMENTS

| CN | 1520045 A | 8/2004 |
| CN | 101060338 A | 10/2007 |

(Continued)

OTHER PUBLICATIONS

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

(Continued)

*Primary Examiner* — Thien Nguyen

(57) ABSTRACT

Embodiments of the present invention provide a polar code rate matching method and a polar code rate matching apparatus. The method includes: performing matrix-based BRO interleaving on a non-systematic polar code output by a polar code encoder, to obtain interleaved bits; and determining, based on the interleaved bits, a rate-matched output sequence. According to the embodiments of the present invention, matrix-based BRO interleaving is performed on a non-systematic polar code, to obtain a rate-matched output sequence, so that a sequence structure after interleaving is more random, which can reduce an FER, thereby improving HARQ performance and ensuring reliability of data transmission.

5 Claims, 7 Drawing Sheets

(51) Int. Cl.
*H03M 13/00* (2006.01)
*H03M 13/13* (2006.01)
*H03M 13/27* (2006.01)

(52) U.S. Cl.
CPC ... *H03M 13/2789* (2013.01); *H03M 13/2792* (2013.01); *H03M 13/616* (2013.01); *H03M 13/6306* (2013.01); *H03M 13/6362* (2013.01); *H04L 1/0041* (2013.01); *H04L 1/0057* (2013.01); *H04L 1/0071* (2013.01); *H04L 1/1812* (2013.01)

(58) Field of Classification Search
CPC ......... H03M 13/6362; H03M 13/6306; H03M 13/2757
See application file for complete search history.

(56) References Cited

U.S. PATENT DOCUMENTS

| | | | |
|---|---|---|---|
| 2007/0189151 A1 | 8/2007 | Pan et al. | |
| 2008/0307293 A1 | 12/2008 | Cheng | |
| 2009/0092118 A1 | 4/2009 | Naka et al. | |
| 2011/0280186 A1* | 11/2011 | Rasquinha | H03M 13/275 370/328 |
| 2013/0091407 A1* | 4/2013 | Cheng | H03M 13/23 714/790 |
| 2013/0145239 A1 | 6/2013 | Pi et al. | |
| 2013/0283116 A1 | 10/2013 | Arikan | |
| 2015/0229337 A1* | 8/2015 | Alhussien | H03M 13/35 714/773 |
| 2016/0072526 A1 | 3/2016 | Cheng | |

FOREIGN PATENT DOCUMENTS

| | | |
|---|---|---|
| CN | 101075857 A | 11/2007 |
| CN | 101090293 A | 12/2007 |
| CN | 101119182 A | 2/2008 |
| CN | 101124731 A | 2/2008 |
| CN | 101330671 A | 12/2008 |
| CN | 101836387 A | 9/2010 |
| CN | 101860412 A | 10/2010 |
| RU | 2407177 C2 | 12/2010 |
| TW | 201246803 A | 11/2012 |

OTHER PUBLICATIONS

Cadambe, Viveck, et al., "Interference Alignment and Spatial Degrees of Freedom for the K User Interference Channel," IEEE Communications Society, ICC 2008, pp. 971-975.

Tal, Ido, et al., "List Decoding of Polar Codes," IEEE International Symposium on Information Theory Proceedings, 2011, pp. 1-5.

* cited by examiner

POLAR CODE RATE MATCHING METHOD AND POLAR CODE RATE MATCHING APPARATUS

CROSS-REFERENCE TO RELATED APPLICATIONS

This application is a continuation of International Application No. PCT/CN2014/073918, filed on Mar. 24, 2014, the disclosure of which is hereby incorporated by reference in its entirety.

TECHNICAL FIELD

Embodiments of the present invention relate to the codec field, and more specifically, to a polar code rate matching method and apparatus.

BACKGROUND

In a communications system, channel coding is generally used to improve reliability of data transmission, so as to ensure communication quality. A polar code (polar code) is an encoding manner that can achieve a Shannon capacity and has low coding-decoding complexity. The polar code is a linear block code. A generator matrix of the polar code is $G_N$, and an encoding process of the polar code is $x_1^N = u_1^N G_N$, where $G_N = B_N F^{\otimes n}$, a code length is $N=2^n$, and $n \geq 0$.

Herein, $$F = \begin{bmatrix} 1 & 0 \\ 1 & 1 \end{bmatrix},$$

and $B_N$ is a transposed matrix, for example, a bit reversal (bit reversal) matrix.

$F^{\otimes n}$ is a Kronecker power (Kronecker power) of F, and is defined as $F^{\otimes n} = F \otimes F^{\otimes (n-1)}$. The polar code may be represented by a coset code (N, K, A, $u_{A^c}$), and an encoding process of the polar code is $x_1^N = u_A G_N(A) \oplus u_{A^c} G_N(A^C)$. Herein, A is a set of information (information) bit indexes, $G_N(A)$ is a sub-matrix obtained by using a row corresponding to an index in the set A in $G_N$, and $G_N(A^C)$ is a sub-matrix obtained by using a row corresponding to an index in a set $A^C$ in $G_N$. $u_{A^c}$ is frozen (frozen) bits, where a quantity of the frozen bits is (N−K), and the frozen bits are known bits. For simplicity, these frozen bits may be set to 0.

A conventional random (quasi-random) puncturing hybrid automatic repeat request (HARQ) technology may be used for the polar code. The so-called random (quasi-random) puncturing is randomly (quasi-randomly) selecting a location for puncturing. At a receive end, an LLR at a puncturing location is set to 0, and a mother code decoding module and method are still used. In this random (quasi-random) puncturing manner, a frame error rate is relatively high, and HARQ performance is relatively poor.

SUMMARY

Embodiments of the present invention provide a polar code rate matching method and apparatus, which can improve HARQ performance of a polar code.

According to a first aspect, a polar code rate matching method is provided, including: dividing a systematic polar code output by a polar code encoder into system bits and parity check bits; performing matrix-based BRO interleaving on the system bits to obtain a first group of interleaved bits, and performing matrix-based BRO interleaving on the parity check bits to obtain a second group of interleaved bits; and determining, based on the first group of interleaved bits and the second group of interleaved bits, a rate-matched output sequence.

With reference to the first aspect, in an implementation manner of the first aspect, the performing matrix-based BRO interleaving on the system bits to obtain a first group of interleaved bits includes: writing the system bits by row to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a column of the third matrix, and using the bits as the first group of interleaved bits; where M1 and M2 are positive integers.

With reference to the first aspect and the foregoing implementation manner of the first aspect, in another implementation manner of the first aspect, the performing matrix-based BRO interleaving on the system bits to obtain a first group of interleaved bits includes: writing the system bits by column to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a row of the third matrix, and using the bits as the first group of interleaved bits; where M1 and M2 are positive integers.

With reference to the first aspect and the foregoing implementation manners of the first aspect, in another implementation manner of the first aspect, the performing matrix-based BRO interleaving on the parity check bits to obtain a second group of interleaved bits includes: writing the parity check bits by row to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a column of the third matrix, and using the bits as the second group of interleaved bits.

With reference to the first aspect and the foregoing implementation manners of the first aspect, in another implementation manner of the first aspect, the performing matrix-based BRO interleaving on the parity check bits to obtain a second group of interleaved bits includes: writing the parity check bits by column to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a row of the third matrix, and using the bits as the second group of interleaved bits.

With reference to the first aspect and the foregoing implementation manners of the first aspect, in another implementation manner of the first aspect, the determining, based on the first group of interleaved bits and the second group of interleaved bits, a rate-matched output sequence includes: sequentially writing the first group of interleaved bits and the second group of interleaved bits into a circular buffer; determining a start location of the rate-matched output sequence in the circular buffer according to a redundancy version; and reading the rate-matched output sequence from the circular buffer according to the start location.

With reference to the first aspect and the foregoing implementation manners of the first aspect, in another implementation manner of the first aspect, the determining, based on the first group of interleaved bits and the second group of interleaved bits, a rate-matched output sequence includes: sequentially combining the first group of interleaved bits and the second group of interleaved bits into a third group of interleaved bits; and sequentially intercepting or repeatedly extracting bits from the third group of interleaved bits to obtain the rate-matched output sequence.

According to a second aspect, a polar code rate matching method is provided, including: performing matrix-based bit reversal order BRO interleaving on a non-systematic polar code output by a polar code encoder, to obtain interleaved bits; and determining, based on the interleaved bits, a rate-matched output sequence.

With reference to the second aspect, in an implementation manner of the second aspect, the performing matrix-based BRO interleaving on a polar code output by a polar code encoder, to obtain interleaved bits includes: writing bits of the non-systematic polar code by row to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a column of the third matrix, and using the bits as the interleaved bits; where M1 and M2 are positive integers.

With reference to the second aspect and the foregoing implementation manner of the second aspect, in another implementation manner of the second aspect, the performing matrix-based BRO interleaving on a polar code output by a polar code encoder, to obtain interleaved bits includes: writing bits of the non-systematic polar code by column to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a row of the third matrix, and using the bits as the interleaved bits; where M1 and M2 are positive integers.

According to a third aspect, a rate matching apparatus is provided, including: a grouping unit, configured to divide a systematic polar code output by a polar polar code encoder into system bits and parity check bits; an interleaving unit, configured to: perform matrix-based BRO interleaving on the system bits to obtain a first group of interleaved bits, and perform matrix-based BRO interleaving on the parity check bits to obtain a second group of interleaved bits; and a determining unit, configured to determine, based on the first group of interleaved bits and the second group of interleaved bits, a rate-matched output sequence.

With reference to the third aspect, in an implementation manner of the third aspect, the interleaving unit is specifically configured to: write to-be-interleaved bits by row to form a first matrix of M1 rows×M2 columns; perform a first substitution operation on a column of the first matrix to obtain a second matrix, where the first substitution operation is a BRO operation with a size of M2; perform a second substitution on a row of the second matrix to obtain a third matrix, where the second substitution operation is a BRO operation with a size of M1; and read bits according to a column of the third matrix; where M1 and M2 are positive integers.

With reference to the third aspect and the foregoing implementation manner of the third aspect, in another implementation manner of the third aspect, the interleaving unit is specifically configured to: write to-be-interleaved bits by column to form a first matrix of M1 rows×M2 columns; perform a first substitution operation on a column of the first matrix to obtain a second matrix, where the first substitution operation is a BRO operation with a size of M2; perform a second substitution on a row of the second matrix to obtain a third matrix, where the second substitution operation is a BRO operation with a size of M1; and read bits according to a row of the third matrix; where M1 and M2 are positive integers.

With reference to the third aspect and the foregoing implementation manners of the third aspect, in another implementation manner of the third aspect, the determining unit is specifically configured to: sequentially write the first group of interleaved bits and the second group of interleaved bits into a circular buffer; determine a start location of the rate-matched output sequence in the circular buffer according to a redundancy version; and read the rate-matched output sequence from the circular buffer according to the start location.

With reference to the third aspect and the foregoing implementation manners of the third aspect, in another implementation manner of the third aspect, the determining unit is specifically configured to: sequentially combine the first group of interleaved bits and the second group of interleaved bits into a third group of interleaved bits; and sequentially intercept or repeatedly extract bits from the third group of interleaved bits to obtain the rate-matched output sequence.

According to a fourth aspect, a polar code rate matching apparatus is provided, including: an interleaving unit, configured to perform matrix-based bit reversal order BRO interleaving on a non-systematic polar code output by a polar code encoder, to obtain interleaved bits; and a determining unit, configured to determine, based on the interleaved bits, a rate-matched output sequence.

With reference to the fourth aspect, in an implementation manner of the fourth aspect, the interleaving unit is specifically configured to: write bits of the non-systematic polar code by row to form a first matrix of M1 rows×M2 columns; perform a first substitution operation on a column of the first matrix to obtain a second matrix, where the first substitution operation is a BRO operation with a size of M2; perform a second substitution on a row of the second matrix to obtain a third matrix, where the second substitution operation is a BRO operation with a size of M1; and read bits according to a column of the third matrix; where M1 and M2 are positive integers.

With reference to the fourth aspect and the foregoing implementation manner of the fourth aspect, in another implementation manner of the fourth aspect, the interleaving unit is specifically configured to: write bits of the non-systematic polar code by column to form a first matrix of M1 rows×M2 columns; perform a first substitution operation on a column of the first matrix to obtain a second matrix, where the first substitution operation is a BRO operation with a size of M2; perform a second substitution on a row of the second matrix to obtain a third matrix, where the second substitution operation is a BRO operation with a size of M1; and read bits according to a row of the third matrix; where M1 and M2 are positive integers.

According to a fifth aspect, a wireless communications apparatus is provided, including a polar polar code encoder, the foregoing rate matching apparatus, and a transmitter.

According to the embodiments of the present invention, system bits and parity check bits are separately interleaved, to obtain a rate-matched output sequence, so that a sequence structure after interleaving is more random, which can reduce an FER (Frame Error Rate, frame error rate), thereby improving HARQ performance and ensuring reliability of data transmission.

BRIEF DESCRIPTION OF THE DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

Figure 1:
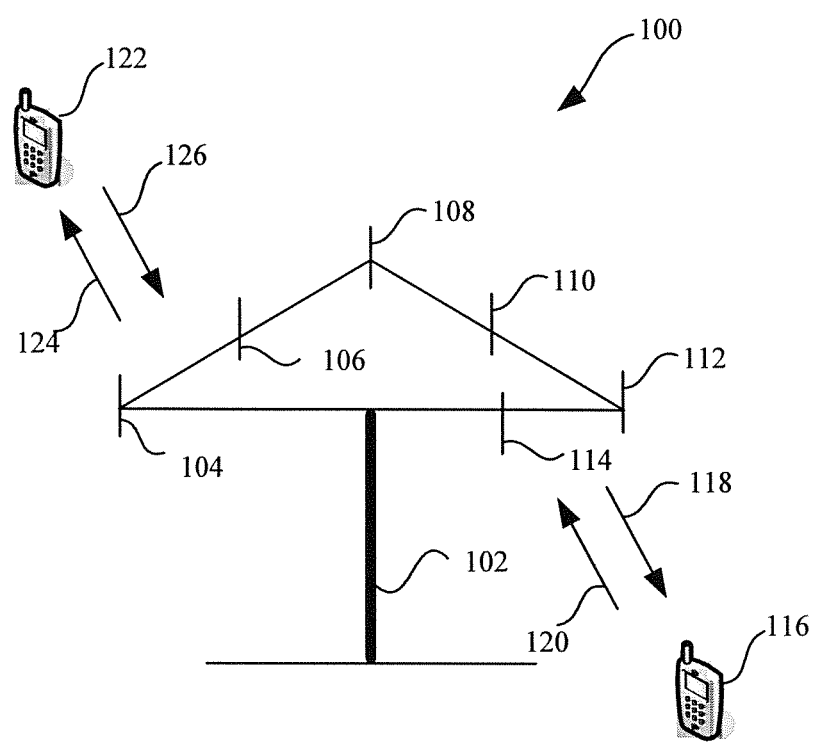
FIG. 1 shows a wireless communications system according to an embodiment of the present invention.

The following clearly and completely describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on the computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from two components interacting with another component in a local system, a distributed system, and/or across a network such as the Internet interacting with other systems by using the signal).

In addition, the embodiments are described with reference to an access terminal. The access terminal may also be referred to as a system, a subscriber unit, a subscriber station, a mobile site, a mobile station, a remote station, a remote terminal, a mobile device, a user terminal, a terminal, a wireless communications device, a user agent, a user apparatus, or a UE (User Equipment, user equipment) The access terminal may be a cellular phone, a cordless phone, a SIP (Session Initiation Protocol, Session Initiation Protocol) phone, a WLL (Wireless Local Loop, wireless local loop) station, a PDA (Personal Digital Assistant, personal digital assistant), a handheld device having a wireless communication function, a computing device, or another processing device connected to a wireless modem. In addition, the embodiments are described with reference to a base station. The base station can be used to communicate with a mobile device; and the base station may be a BTS (Base Transceiver Station, base transceiver station) in GSM (Global System of Mobile communication, Global System for Mobile Communications) or CDMA (Code Division Multiple Access, Code Division Multiple Access), or may be an NB (NodeB, NodeB) in WCDMA (Wideband Code Division Multiple Access, Wideband Code Division Multiple Access), or may further be an eNB or eNodeB (Evolutional Node B, evolved NodeB) in LTE (Long Term Evolution, Long Term Evolution), a relay station or an access point, a base station device in a future 5 G network, or the like.

In addition, aspects or features of the present invention may be implemented as a method, an apparatus or a product that uses standard programming and/or engineering technologies. The term "product" used in this application covers a computer program that can be accessed from any computer readable component, carrier or medium. For example, the computer-readable medium may include but is not limited to: a magnetic storage component (for example, a hard disk, a floppy disk or a magnetic tape), an optical disc (for example, a CD (Compact Disk, compact disk), and a DVD (Digital Versatile Disk, digital versatile disk)), a smart card and a flash memory component (for example, EPROM (Erasable Programmable Read-Only Memory, erasable programmable read-only memory), a card, a stick, or a key drive). In addition, various storage media described in this specification may indicate one or more devices and/or other machine-readable media that are used to store information. The term "machine readable media" may include but is not limited to a radio channel, and various other media that can store, contain and/or carry an instruction and/or data.

Now, referring to FIG. 1, FIG. 1 shows a wireless communications system 100 according to the embodiments described in this specification. The system 100 includes a base station 102, where the base station 102 may include multiple antenna groups. For example, one antenna group may include antennas 104 and 106, another antenna group may include antennas 108 and 110, and an additional group may include antennas 112 and 114. Two antennas are shown for each antenna group. However, more or less antennas may be used for each group. The base station 102 may additionally include a transmitter chain and a receiver chain. A person of ordinary skill in the art may understand that both the transmitter chain and the receiver chain may include multiple components related to signal sending and receiving (for example, a processor, a modulator, a multiplexer, a demodulator, a demultiplexer, or an antenna).

The base station 102 may communicate with one or more access terminals (for example, an access terminal 116 and an access terminal 122). However, it may be understood that the base station 102 basically can communicate with any quantity of access terminals similar to the access terminals 116 and 122. The access terminals 116 and 122 may be, for example, a cellular phone, a smart phone, a portable computer, a handheld communications device, a handheld computing device, a satellite radio apparatus, a global positioning system, a PDA, and/or any other appropriate device configured to perform communication in the wireless communications system 100. As shown in the figure, the access terminal 116 communicates with the antennas 112 and 114, where the antennas 112 and 114 send information to the access terminal 116 by using a forward link 118, and receive information from the access terminal 116 by using a reverse link 120. In addition, the access terminal 122 communicates with the antennas 104 and 106, where the antennas 104 and 106 send information to the access terminal 122 by using a forward link 124, and receive information from the access terminal 122 by using a reverse link 126. In an FDD (Frequency Division Duplex, frequency division duplex) system, for example, the forward link 118 may use a different frequency band from the reverse link 120, and the forward link 124 may use a different frequency band from the reverse link 126. In addition, in a TDD (Time Division Duplex, time division duplex) system, the forward link 118 and the reverse link 120 may use a same frequency band, and the forward link 124 and the reverse link 126 may use a same frequency band.

Each group of antennas and/or areas designed for communication is referred to as a sector of the base station 102. For example, an antenna group may be designed to communicate with an access terminal in a sector of an area covered by the base station 102. During communication performed by using the forward links 118 and 124, a transmit antenna of the base station 102 may improve, by means of beamforming, signal-to-noise ratios of the forward links 118 and 124 for the access terminals 116 and 122. In addition, compared with sending, by a base station by using a single antenna, information to all access terminals of the base station, sending, by the base station 102 by means of beamforming, information to the access terminals 116 and 122 that are dispersed randomly in a related coverage area causes less interference to a mobile device in a neighboring cell.

In a given time, the base station 102, the access terminal 116, and/or the access terminal 122 may be a sending wireless communications apparatus and/or a receiving wireless communications apparatus. When sending data, the sending wireless communications apparatus may encode the data for transmission. Specifically, the sending wireless communications apparatus may have (for example, generate, obtain, or store in a memory) a particular quantity of information bits to be sent to the receiving wireless communications apparatus through a channel. The information bits may be included in a transport block (or multiple transport blocks) of data, and may be segmented to generate multiple code blocks. In addition, the sending wireless communications apparatus may encode each code block by using a polar code encoder (which is not shown).

Figure 2:
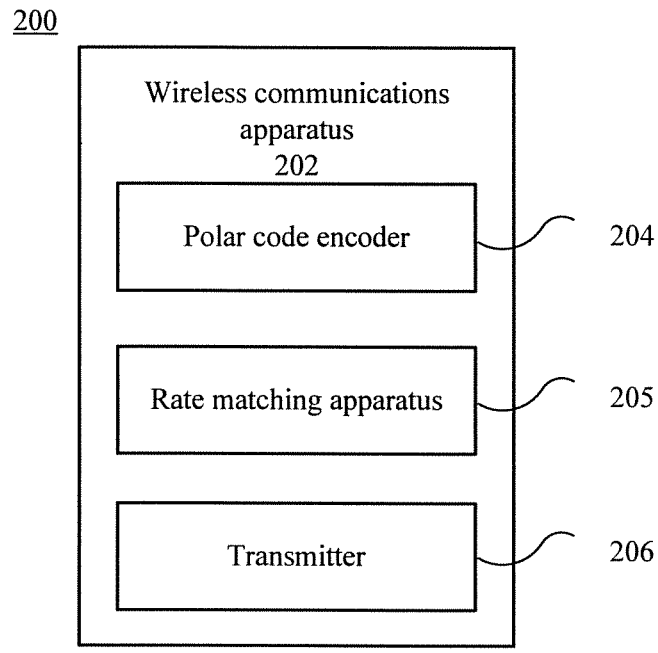
FIG. 2 shows a system for executing a polar code processing method in a wireless communications environment.

Now, proceeding to FIG. 2, FIG. 2 shows a system 200 for executing a polar code processing method in a wireless communications environment. The system 200 includes a wireless communications apparatus 202, where the wireless communications apparatus 202 is shown to send data through a channel. Although it is shown that the wireless communications apparatus 202 sends data, the wireless communications apparatus 202 may further receive data through a channel (for example, the wireless communications apparatus 202 may simultaneously send and receive data, the wireless communications apparatus 202 may send and receive data at different moments, or a combination thereof). The wireless communications apparatus 202 may be, for example, a base station (for example, the base station 102 in FIG. 1) or an access terminal (for example, the access terminal 116 in FIG. 1 or the access terminal 122 in FIG. 1).

The wireless communications apparatus 202 may include a polar code encoder 204, a rate matching apparatus 205, and a transmitter 206.

The polar code encoder 204 is configured to encode to-be-transferred data to obtain a corresponding polar code.

If the polar code obtained after encoding by the polar code encoder 204 is a systematic code, the rate matching apparatus 205 may be configured to: divide the systematic polar code output by the polar code encoder 204 into system bits and parity check bits, perform matrix-based BRO interleaving on the system bits to obtain a first group of interleaved bits, perform matrix-based BRO interleaving on the parity check bits to obtain a second group of interleaved bits, and then determine, based on the first group of interleaved bits and the second group of interleaved bits, a rate-matched output sequence.

If the polar code obtained after encoding by the polar code encoder 204 is a non-systematic code, the rate matching apparatus 205 may be configured to perform matrix-based BRO interleaving on the non-systematic polar code entirely to obtain interleaved bits, and then determine, based on the interleaved bits, a rate-matched output sequence.

In addition, the transmitter 206 may subsequently transfer, on a channel, the rate-matched output sequence that is processed by the rate matching apparatus 205. For example, the transmitter 206 may send related data to another different wireless communications apparatus (which is not shown).

In this embodiment of the present invention, if the polar code obtained after encoding by the polar code encoder 204 is a systematic code, the polar code may be referred to as a systematic polar code. If the polar code obtained after encoding by the polar code encoder 204 is a non-systematic code, the polar code may be referred to as a non-systematic polar code.

Generally, the systematic code refers to a code whose generator matrix G is in the following form or an equivalent code thereof:

$G=[I_k, P]$, where $I_k$ is a k-order unit matrix, and P is a parity check matrix.

A code except the systematic code may be referred to as a non-systematic code.

Figure 3:
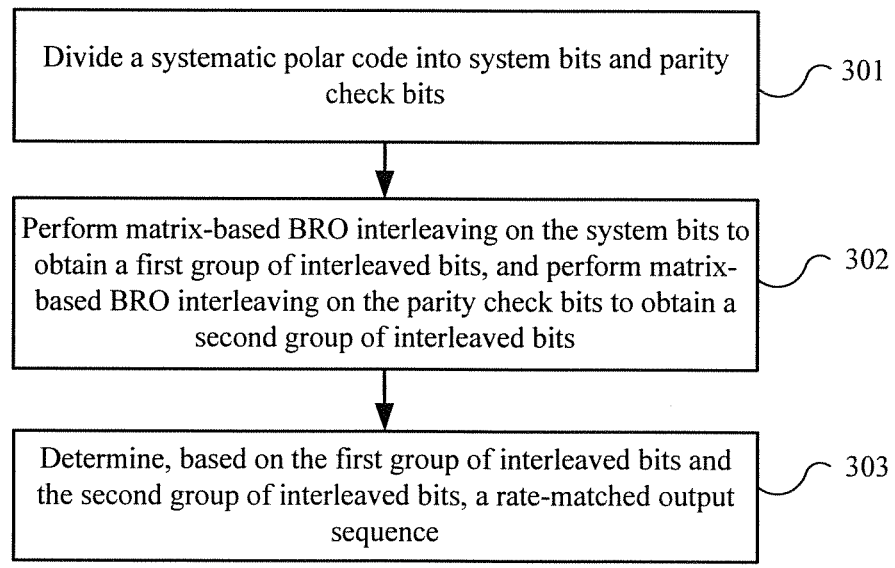
FIG. 3 is a flowchart of a polar code rate matching method according to an embodiment of the present invention.

FIG. 3 is a flowchart of a polar code rate matching method according to an embodiment of the present invention. The method in FIG. 3 is executed by a polar code encoding and transmitting end (for example, the rate matching apparatus 205 in FIG. 2).

301: Divide a systematic polar code into system bits and parity check bits.

The system bits are bits corresponding to a unit matrix $I_k$ part in the foregoing generator matrix G, and the parity check bits are bits corresponding to a parity check matrix P part in the foregoing generator matrix G.

302: Perform matrix-based BRO interleaving on the system bits to obtain a first group of interleaved bits (Set1), and perform matrix-based BRO interleaving on the parity check bits to obtain a second group of interleaved bits (Set2).

303: Determine, based on the first group of interleaved bits and the second group of interleaved bits, a rate-matched output sequence.

According to this embodiment of the present invention, system bits and parity check bits are separately interleaved, to obtain a rate-matched output sequence, so that a sequence structure after interleaving is more random, which can reduce an FER, thereby improving HARQ performance and ensuring reliability of data transmission.

In addition, because impacts of interleaving processing on minimum distances of the system bits and the parity check bits are different, when the system bits and the parity check bits are separately interleaved, a minimum distance of interleaved bits can be further increased, thereby improving rate matching performance of a polar code.

In this embodiment of the present invention, a Matrix_BRO interleaver may be used for matrix-based BRO interleaving. The Matrix_BRO interleaver has matrix space of M1 rows×M2 columns, where M1 and M2 are positive integers. Assuming that a length of to-be-interleaved bits is M1×M2, the Matrix_BRO interleaver may first write the to-be-interleaved bits by row to form a first matrix of M1 rows×M2 columns. Then the Matrix_BRO interleaver may perform a first substitution operation on a column of the first matrix to obtain a second matrix, where the first substitution operation is a BRO operation with a size of M2, where $\pi_c(i)=BRO(i,M2)$, and $i=1,2,\ldots$.

Then the Matrix_BRO interleaver may perform a second substitution operation on a row of the second matrix to obtain a third matrix, where the second substitution operation is a BRO operation with a size of M1, where $\pi_r(i)=BRO(i,M1)$, and $i=1,2,\ldots$.

The Matrix_BRO interleaver may read bits according to a column of the second matrix, and use the bits as an interleaving result.

In an equivalent processing manner, the Matrix_BRO interleaver may first write the to-be-interleaved bits by column to form a first matrix of M1 rows×M2 columns. Then the Matrix_BRO interleaver may perform a first substitution operation on a column of the first matrix to obtain a second matrix, where the first substitution operation is a bit reversal order BRO operation with a size of M2, where $\pi_c(i)=BRO(i,M2)$, and $i=1,2,\ldots$.

Then the Matrix_BRO interleaver may perform a second substitution operation on a row of the second matrix to obtain a third matrix, where the second substitution operation is a bit reversal order BRO operation with a size of M1, where $\pi_r(i)=BRO(i,M1)$, and $i=1,2,\ldots$.

The Matrix_BRO interleaver may read bits according to a row of the second matrix, and use the bits as an interleaving result.

In addition, in this embodiment of the present invention, a sequence of the foregoing substitution operations is not limited. For example, it may be that row substitution is first performed, and then column substitution is performed. Such an equivalent processing manner also falls within the scope of the embodiments of the present invention.

When M1 is an integer power of 2, that is, $M1=2^s$, where s is a positive integer, BRO (i, M1) may be obtained in the following manner: (1) representing i as a binary number ($b_0$, $b_1$, ..., $b_s$); (2) performing order reversing on the binary number to obtain ($b_s$, $b_{s-1}$, ..., $b_1$, $b_0$); and (3) converting the binary number obtained after order reversing into a decimal number, where the binary number is a value of BRO (i, M1).

When M1 is not an integer power of 2, a pruned BRO is obtained by means of mapping and pruning (prune) in a case in which M1 is an integer power of 2.

For example, in an embodiment, in step 302, when matrix-based BRO interleaving is performed on the system bits to obtain the first group of interleaved bits, the system bits may be written by row (or by column) to form a first matrix of M1 rows×M2 columns; a first substitution operation is performed on a column of the first matrix to obtain a second matrix, where the first substitution operation is a BRO operation with a size of M2; then, a second substitution operation is performed on a row of the second matrix to obtain a third matrix, where the second substitution operation is a BRO operation with a size of M1; and bits are read according to a column (or according to a row) of the third matrix, and are used as the first group of interleaved bits; where M1 and M2 are positive integers.

Optionally, in another embodiment, in step 302, when matrix-based BRO interleaving is performed on the parity check bits to obtain the second group of interleaved bits, the parity check bits may be written by row (or by column) to form a first matrix of M1 rows×M2 columns; a first substitution operation is performed on a column of the first matrix to obtain a second matrix, where the first substitution operation is a BRO operation with a size of M2; then, a second substitution operation is performed on a row of the second matrix to obtain a third matrix, where the second substitution operation is a BRO operation with a size of M1; and bits are read according to a column (or according to a row) of the third matrix, and are used as the second group of interleaved bits; where M1 and M2 are positive integers.

Optionally, in another embodiment, in step 303, when the rate-matched output sequence is determined based on the first group of interleaved bits and the second group of interleaved bits, a circular buffer (Circular Buffer) may be used. Specifically, first, the first group of interleaved bits and the second group of interleaved bits may be sequentially written into the circular buffer, that is, the first group of interleaved bits is first written into the circular buffer and then the second group of interleaved bits is written into the circular buffer. Then a start location of the rate-matched output sequence in the circular buffer may be determined according to a redundancy version (RV, Redundancy Version), and bits are read from the circular buffer according to the start location and are used as the rate-matched output sequence.

In an HARQ process of a polar code, system bits and parity check bits are of different importance, and specifically, the system bits are more important than the parity check bits. It is assumed that a first group of interleaved bits obtained by interleaving the system bits is Set1, and a second group of interleaved bits obtained by interleaving the parity check bits is Set2. Set1 is written into a circular buffer before Set2, so that more system bits can be reserved in a rate-matched output sequence, which can improve HARQ performance of the polar code.

Optionally, in another embodiment, in step 303, when the rate-matched output sequence is determined based on the first group of interleaved bits and the second group of interleaved bits, the first group of interleaved bits (Set1) and the second group of interleaved bits (Set2) may be sequentially combined into a third group of interleaved bits (Set3), that is, in Set3, all bits in Set1 are located before all bits in Set2. Then bits may be sequentially intercepted or repeatedly extracted from Set3 to obtain the rate-matched output sequence required for each time of retransmission. For example, when a length La of bits that need to be retransmitted is shorter than a length Lb of Set3, some bits whose length is La may be intercepted from Set3 as the rate-matched output sequence. For another example, when a length La of bits that need to be retransmitted is longer than a length Lb of Set3, after all bits in Set3 are read, the bits in Set3 may be read again from the beginning, which is repeated until the rate-matched output sequence whose length is La is read.

In an HARQ process of a polar code, system bits and parity check bits are of different importance, and specifically, the system bits are more important than the parity check bits. Therefore, a first group of interleaved bits Set1 obtained by interleaving the system bits is placed before a second group of interleaved bits Set2 obtained by interleaving the parity check bits, so that the first group of interleaved bits Set1 and the second group of interleaved bits Set2 are combined into a third group of interleaved bits Set3, and in this way, more system bits can be reserved in a rate-matched output sequence that is finally obtained, thereby improving HARQ performance of the polar code.

Figure 4:
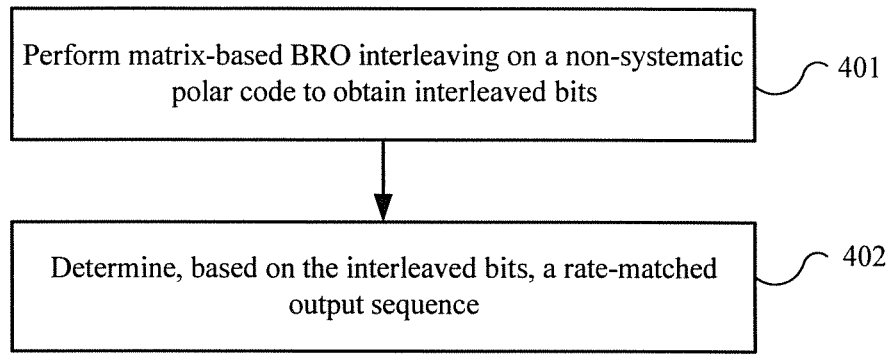
FIG. 4 is a flowchart of a polar polar code rate matching method according to another embodiment of the present invention.

FIG. 4 is a flowchart of a polar polar code rate matching method according to another embodiment of the present invention. The method in FIG. 4 is executed by a polar code encoding and transmitting end (for example, the rate matching apparatus 205 in FIG. 2).

401: Perform matrix-based BRO interleaving on a non-systematic polar code output by a polar code encoder, to obtain interleaved bits.

402: Determine, based on the interleaved bits, a rate-matched output sequence.

According to this embodiment of the present invention, matrix-based BRO interleaving is performed on a non-systematic polar code entirely, so that a minimum distance of interleaved bits is increased, thereby improving rate matching performance of the polar code.

Optionally, in an embodiment, in step 401, when matrix-based BRO interleaving is performed on the non-systematic polar code to obtain the interleaved bits, bits of the non-systematic polar code may be written by row (or by column) to form a first matrix of M1 rows×M2 columns; a first substitution operation is performed on a column of the first matrix to obtain a second matrix, where the first substitution operation is a BRO operation with a size of M2; then, a second substitution operation is performed on a row of the second matrix to obtain a third matrix, where the second substitution operation is a BRO operation with a size of M1; and bits are read according to a column (or according to a row) of the third matrix, and are used as the interleaved bits; where M1 and M2 are positive integers.

Optionally, in another embodiment, in step 402, the interleaved bits may be written into a circular buffer, a start location of the rate-matched output sequence in the circular buffer is determined according to a redundancy version, and the rate-matched output sequence is read from the circular buffer according to the start location.

Optionally, in another embodiment, in step 402, bits may be sequentially intercepted or repeatedly extracted from the interleaved bits to obtain the rate-matched output sequence required for each time of retransmission.

According to this embodiment of the present invention, interleaving is performed on a non-systematic polar code entirely, so that a minimum distance of interleaved bits is increased, thereby improving rate matching performance of the polar code.

Figure 5:
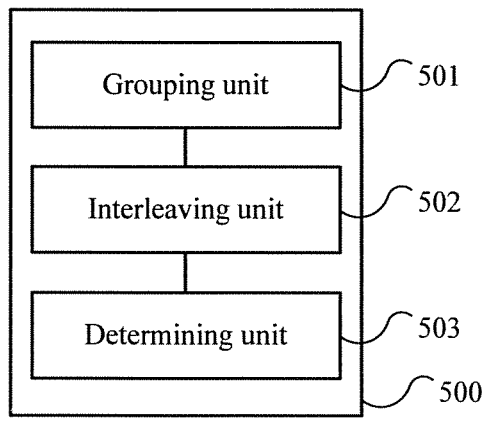
FIG. 5 is a block diagram of a rate matching apparatus according to an embodiment of the present invention.

FIG. 5 is a block diagram of a rate matching apparatus according to an embodiment of the present invention. The rate matching apparatus 500 in FIG. 5 may be located on a base station or user equipment, and includes a grouping unit 501, an interleaving unit 502, and a determining unit 503.

The grouping unit 501 divides a systematic polar code into system bits and parity check bits. The interleaving unit 502 performs matrix-based BRO interleaving on the system bits to obtain a first group of interleaved bits, and performs matrix-based BRO interleaving on the parity check bits to obtain a second group of interleaved bits. The determining unit 503 determines, based on the first group of interleaved bits and the second group of interleaved bits, a rate-matched output sequence.

According to this embodiment of the present invention, system bits and parity check bits are separately interleaved, to obtain a rate-matched output sequence, so that a sequence structure after interleaving is more random, which can reduce an FER, thereby improving HARQ performance and ensuring reliability of data transmission.

In addition, because impacts of interleaving processing on minimum distances of the system bits and the parity check bits are different, when the system bits and the parity check bits are separately interleaved, a minimum distance of interleaved bits can be further increased, thereby improving rate matching performance of a polar code.

Optionally, in an embodiment, the interleaving unit 502 may use a Matrix_BRO interleaver.

Optionally, in an embodiment, the interleaving unit 502 may write bits (for example, the system bits or the parity check bits) of the interleaved bits by row (or by column) to form a first matrix of M1 rows×M2 columns; perform a first substitution operation on a column of the first matrix to obtain a second matrix, where the first substitution operation is a BRO operation with a size of M2; perform a second substitution operation on a row of the second matrix to obtain a third matrix, where the second substitution operation is a BRO operation with a size of M1; and read bits according to a column (or according to a row) of the third matrix; where M1 and M2 are positive integers.

Optionally, in another embodiment, the determining unit 503 may sequentially write the first group of interleaved bits and the second group of interleaved bits into a circular buffer, determine a start location of the rate-matched output sequence in the circular buffer according to a redundancy version, and read the rate-matched output sequence from the circular buffer according to the start location.

In an HARQ process of a polar code, system bits and parity check bits are of different importance, and specifically, the system bits are more important than the parity check bits. It is assumed that a first group of interleaved bits obtained by interleaving the system bits is Set1, and a second group of interleaved bits obtained by interleaving the parity check bits is Set2. Set1 is written into a circular buffer before Set2, so that more system bits can be reserved in a rate-matched output sequence, which can improve HARQ performance of the polar code.

Optionally, in another embodiment, the determining unit 503 may sequentially combine the first group of interleaved bits and the second group of interleaved bits into a third group of interleaved bits, and sequentially intercept or repeatedly extract bits from the third group of interleaved bits to obtain the rate-matched output sequence.

In an HARQ process of a polar code, system bits and parity check bits are of different importance, and specifically, the system bits are more important than the parity check bits. Therefore, a first group of interleaved bits Set1 obtained by interleaving the system bits is placed before a second group of interleaved bits Set2 obtained by interleaving the parity check bits, so that the first group of interleaved bits Set1 and the second group of interleaved bits Set2 are combined into a third group of interleaved bits Set3, and in this way, more system bits can be reserved in a rate-matched output sequence that is finally obtained, thereby improving HARQ performance of the polar code.

Figure 6:
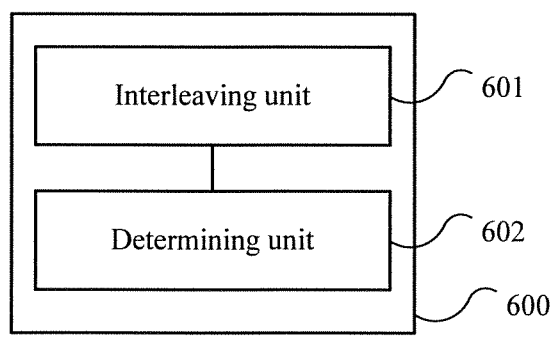
FIG. 6 is a block diagram of a rate matching apparatus according to another embodiment of the present invention.

FIG. 6 is a block diagram of a rate matching apparatus according to another embodiment of the present invention. The rate matching apparatus 600 in FIG. 6 may be located on a base station or user equipment, and includes an interleaving unit 601 and a determining unit 602.

The interleaving unit 601 performs matrix-based BRO interleaving on a non-systematic polar code to obtain interleaved bits. The determining unit 502 determines, based on the interleaved bits, a rate-matched output sequence.

According to this embodiment of the present invention, matrix-based BRO interleaving is performed on a non-systematic polar code entirely, so that a minimum distance of interleaved bits is increased, thereby improving rate matching performance of the polar code.

Optionally, in an embodiment, the interleaving unit 601 may write to-be-interleaved bits (that is, bits of the non-systematic polar code) by row (or by column) to form a first matrix of M1 rows×M2 columns; perform a first substitution operation on a column of the first matrix to obtain a second matrix, where the first substitution operation is a BRO operation with a size of M2; perform a second substitution operation on a row of the second matrix to obtain a third matrix, where the second substitution operation is a BRO operation with a size of M1; and read bits according to a column (or according to a row) of the third matrix; where M1 and M2 are positive integers.

Optionally, in another embodiment, the determining unit 602 may write the interleaved bits into a circular buffer, determine a start location of the rate-matched output sequence in the circular buffer according to a redundancy version, and read the rate-matched output sequence from the circular buffer according to the start location.

Optionally, in another embodiment, the determining unit 602 may sequentially intercept or repeatedly extracted bits from the interleaved bits to obtain the rate-matched output sequence.

Figure 7:
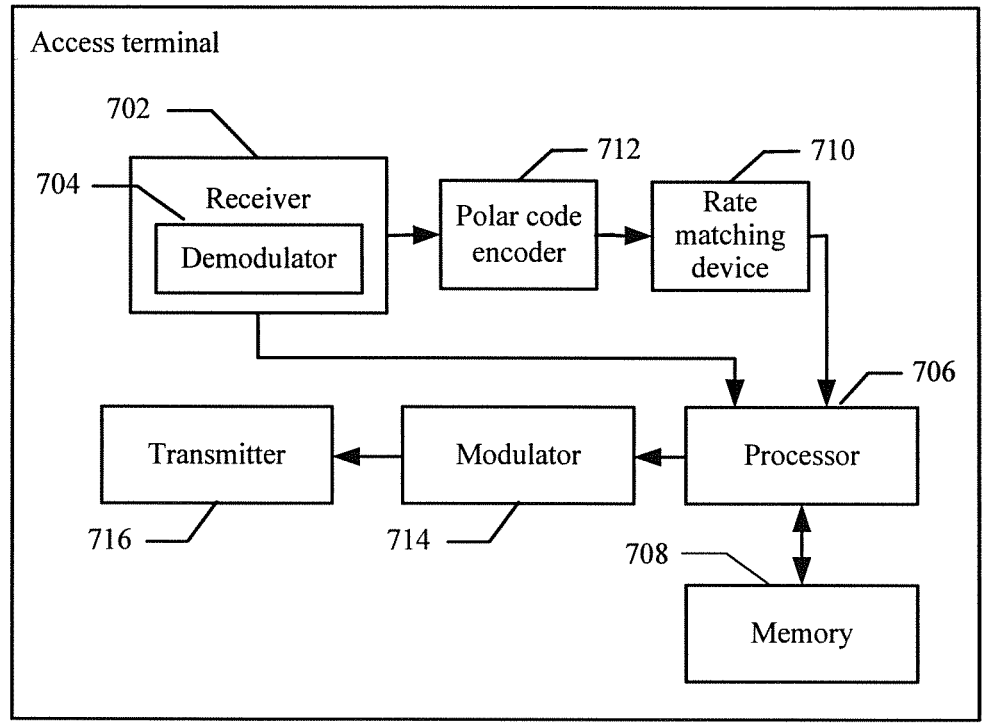
FIG. 7 is a schematic diagram of an access terminal that helps execute a polar code processing method in a wireless communications system.

FIG. 7 is a schematic diagram of an access terminal 700 that helps execute the foregoing polar code processing method in a wireless communications system. The access terminal 700 includes a receiver 702. The receiver 702 is configured to: receive a signal from, for example, a receive antenna (which is not shown), perform a typical action (for example, filtering, amplification, or down-conversion) on the received signal, and digitize an adjusted signal to obtain a sample. The receiver 702 may be, for example, an MMSE (minimum mean square error, Minimum Mean-Squared Error) receiver. The access terminal 700 may further include a demodulator 704, where the demodulator 704 may be configured to demodulate received symbols and provide the received symbols to a processor 706 for channel estimation. The processor 706 may be a processor that is dedicatedly configured to analyze information received by the receiver 702 and/or generate information to be sent by a transmitter 716, a processor that is configured to control one or more components of the access terminal 700, and/or a controller that is configured to analyze information received by the receiver 702, generate information to be sent by a transmitter 716, and control one or more components of the access terminal 700.

The access terminal 700 may additionally include a memory 708, where the memory 708 is operationally coupled to the processor 706, and stores the following data: data to be sent, received data, and any other appropriate information related to execution of various operations and functions described in this specification. The memory 708 may additionally store a protocol and/or an algorithm related to polar code processing.

It can be understood that a data storage apparatus (for example, the memory 708) described in this specification may be a volatile memory or a nonvolatile memory, or may include both a volatile memory and a nonvolatile memory. It is exemplary rather than limitative that the nonvolatile memory may include: a ROM (Read-Only Memory, read-only memory), a PROM (Programmable ROM, programmable read-only memory), an EPROM (Erasable PROM, erasable programmable read-only memory) an EEPROM (Electrically EPROM, electrically erasable programmable read-only memory), or a flash memory. The volatile memory may include a RAM (Random Access Memory, random access memory), and is used as an external cache. It is exemplarily rather than limitatively noted that RAMs in many forms can be used, for example, an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory) an SLDRAM (Synchlink DRAM, synchlink dynamic random access memory), and a DR RAM (Direct Rambus RAM, Direct Rambus random access memory). The memory 708 in the system and method described in this specification is intended to include, but is not limited to, these memories and any other memory of an appropriate type.

In an actual application, the receiver 702 may be further coupled to a rate matching device 710. The rate matching device 710 may be basically similar to the rate matching apparatus 205 in FIG. 2. In addition, the access terminal 700 may further include a polar code encoder 712. The polar code encoder 712 is basically similar to the polar code encoder 204 in FIG. 2.

If the polar code encoder 712 obtains a systematic polar code by means of encoding, the rate matching device 710 may be configured to: divide the systematic polar code into system bits and parity check bits, perform matrix-based BRO interleaving on the system bits to obtain a first group of interleaved bits (Set1), perform matrix-based BRO interleaving on the parity check bits to obtain a second group of interleaved bits (Set2), and determine, based on the first group of interleaved bits and the second group of interleaved bits, a rate-matched output sequence.

According to this embodiment of the present invention, system bits and parity check bits are separately interleaved, to obtain a rate-matched output sequence, so that a sequence structure after interleaving is more random, which can reduce an FER, thereby improving HARQ performance and ensuring reliability of data transmission.

In addition, because impacts of interleaving processing on minimum distances of the system bits and the parity check bits are different, when the system bits and the parity check bits are separately interleaved, a minimum distance of interleaved bits can be further increased, thereby improving rate matching performance of a polar code.

In another aspect, if the polar code encoder 712 obtains a non-systematic polar code by means of encoding, the rate matching device 710 may be configured to: perform matrix-based BRO interleaving on the non-systematic polar code entirely to obtain interleaved bits, and determine, based on the interleaved bits, a rate-matched output sequence.

According to this embodiment of the present invention, matrix-based BRO interleaving is performed on a non-systematic polar code entirely, so that a minimum distance of interleaved bits is increased, thereby improving rate matching performance of the polar code.

Interleaving processing performed by the rate matching device 710 may include: writing to-be-interleaved bits by row (or by column) to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a column of the third matrix; where M1 and M2 are positive integers.

Optionally, in another embodiment, when determining, based on the first group of interleaved bits and the second group of interleaved bits, the rate-matched output sequence, the rate matching device 710 may use a circular buffer. Specifically, first, the rate matching device 710 may sequentially write the first group of interleaved bits and the second group of interleaved bits into the circular buffer, that is, first write the first group of interleaved bits into the circular buffer and then write the second group of interleaved bits into the circular buffer. Then a start location of the rate-matched output sequence in the circular buffer may be determined according to a redundancy version, and bits are read from the circular buffer according to the start location and are used as the rate-matched output sequence.

In an HARQ process of a polar code, system bits and parity check bits are of different importance, and specifically, the system bits are more important than the parity check bits. It is assumed that a first group of interleaved bits obtained by interleaving the system bits is Set1, and a second group of interleaved bits obtained by interleaving the parity check bits is Set2. Set1 is written into a circular buffer before Set2, so that more system bits can be reserved in a rate-matched output sequence, which can improve HARQ performance of the polar code.

Optionally, in another embodiment, when determining, based on the first group of interleaved bits and the second group of interleaved bits, the rate-matched output sequence, the rate matching device 710 may sequentially combine the first group of interleaved bits (Set1) and the second group of interleaved bits (Set2) into a third group of interleaved bits (Set3), that is, in Set3, all bits in Set1 are located before all bits in Set2. Then bits may be sequentially intercepted or repeatedly extracted from Set3 to obtain the rate-matched output sequence required for each time of retransmission. For example, when a length La of bits that need to be retransmitted is shorter than a length Lb of Set3, some bits whose length is La may be intercepted from Set3 as the rate-matched output sequence. For another example, when a length La of bits that need to be retransmitted is longer than a length Lb of Set3, after all bits in Set3 are read, the bits in Set3 may be read again from the beginning, which is repeated until the rate-matched output sequence whose length is La is read.

In an HARQ process of a polar code, system bits and parity check bits are of different importance, and specifically, the system bits are more important than the parity check bits. Therefore, a first group of interleaved bits Set1 obtained by interleaving the system bits is placed before a second group of interleaved bits Set2 obtained by interleaving the parity check bits, so that the first group of interleaved bits Set1 and the second group of interleaved bits Set2 are combined into a third group of interleaved bits Set3, and in this way, more system bits can be reserved in a rate-matched output sequence that is finally obtained, thereby improving HARQ performance of the polar code.

Optionally, in another embodiment, when determining, based on the interleaved bits, the rate-matched output sequence, the rate matching device 710 may write the interleaved bits into a circular buffer, determine a start location of the rate-matched output sequence in the circular buffer according to a redundancy version, and read the rate-matched output sequence from the circular buffer according to the start location.

Optionally, in another embodiment, when determining, based on the interleaved bits, the rate-matched output sequence, the rate matching device 710 may sequentially intercept or repeatedly extract bits from the interleaved bits to obtain the rate-matched output sequence required for each time of retransmission.

In addition, the access terminal 700 may further include a modulator 714 and the transmitter 716. The transmitter 716 is configured to send a signal to, for example, abase station or another access terminal. Although it is shown that the polar code encoder 712, the rate matching device 710, and/or the modulator 714 is separated from the processor 706, it may be understood that the polar code encoder 712, the rate matching device 710, and/or the modulator 714 may be a part of the processor 706 or multiple processors (which are not shown).

Figure 8:
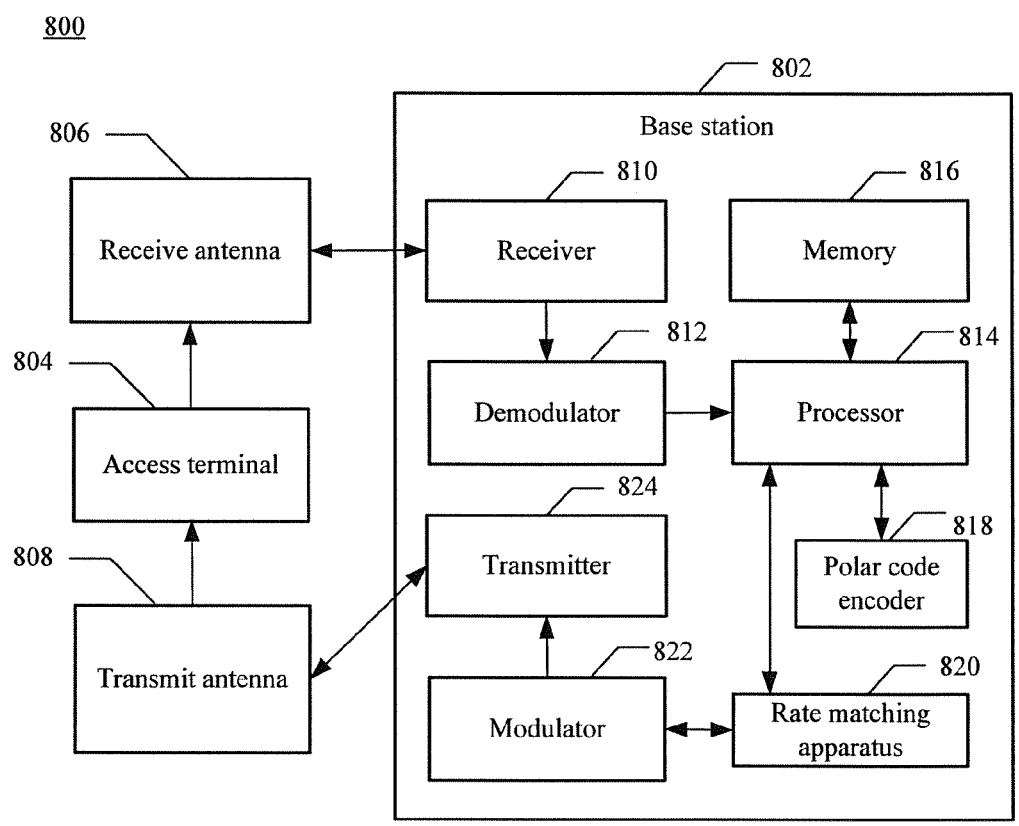
FIG. 8 is a schematic diagram of a system in which a polar code processing method is executed in a wireless communications environment.

FIG. 8 is a schematic diagram of a system 800 in which the foregoing polar code processing method is executed in a wireless communications environment. The system 800 includes a base station 802 (for example, an access point, a NodeB, or an eNB). The base station 802 has a receiver 810 that receives a signal from one or more access terminals 804 by using multiple receive antennas 806, and a transmitter 824 that transmits a signal to the one or more access terminals 804 by using a transmit antenna 808. The receiver 810 may receive information from the receive antenna 806, and is operationally associated to a demodulator 812 that demodulates the received information. A symbol obtained after demodulation is analyzed by using a processor 814 similar to the processor described in FIG. 7. The processor 814 is connected to a memory 816. The memory 816 is configured to store data to be sent to the access terminal 804 (or a different base station (which is not shown)) or data received from the access terminal 804 (or a different base station (which is not shown)), and/or any other appropriate information related to execution of actions and functions described in this specification. The processor 814 may be further coupled to a polar code encoder 818 and a rate matching apparatus 820.

According to an aspect of this embodiment of the present invention, the rate matching apparatus 820 may be configured to: divide a systematic polar code output by the polar code encoder 818 into system bits and parity check bits, interleave the system bits to obtain a first group of interleaved bits (Set1), interleave the parity check bits to obtain a second group of interleaved bits (Set2), and determine, based on the first group of interleaved bits and the second group of interleaved bits, a rate-matched output sequence.

According to this embodiment of the present invention, system bits and parity check bits are separately interleaved, to obtain a rate-matched output sequence, so that a sequence structure after interleaving is more random, which can reduce an FER, thereby improving HARQ performance and ensuring reliability of data transmission.

In addition, because impacts of interleaving processing on minimum distances of the system bits and the parity check bits are different, when the system bits and the parity check bits are separately interleaved, a minimum distance of interleaved bits can be further increased, thereby improving rate matching performance of a polar code.

According to another aspect of this embodiment of the present invention, the rate matching apparatus 820 may be configured to: perform matrix-based BRO interleaving on a non-systematic polar code entirely to obtain interleaved bits, where the non-systematic polar code is output by the polar code encoder 712; and determine, based on the interleaved bits, a rate-matched output sequence.

According to this embodiment of the present invention, matrix-based BRO interleaving is performed on a non-systematic polar code entirely, so that a minimum distance of interleaved bits is increased, thereby improving rate matching performance of the polar code.

Optionally, in an embodiment, interleaving processing performed by the rate matching apparatus 820 may include: writing to-be-interleaved bits by row (or by column) to form a first matrix of M1 rows×M2 columns; performing a first substitution operation on a column of the first matrix to obtain a second matrix, where the first substitution operation is a BRO operation with a size of M2; performing a second substitution operation on a row of the second matrix to obtain a third matrix, where the second substitution operation is a BRO operation with a size of M1; and reading bits according to a column (or according to a row) of the third matrix; where M1 and M2 are positive integers.

Optionally, in another embodiment, when determining, based on the first group of interleaved bits and the second group of interleaved bits, the rate-matched output sequence, the rate matching apparatus 820 may use a circular buffer. Specifically, first, the rate matching apparatus 820 may sequentially write the first group of interleaved bits and the second group of interleaved bits into the circular buffer, that is, first write the first group of interleaved bits into the circular buffer and then write the second group of interleaved bits into the circular buffer. Then a start location of the rate-matched output sequence in the circular buffer may be determined according to a redundancy version, and bits are read from the circular buffer according to the start location and are used as the rate-matched output sequence.

In an HARQ process of a polar code, system bits and parity check bits are of different importance, and specifically, the system bits are more important than the parity check bits. It is assumed that a first group of interleaved bits obtained by interleaving the system bits is Set1, and a second group of interleaved bits obtained by interleaving the parity check bits is Set2. Set1 is written into a circular buffer before Set2, so that more system bits can be reserved in a rate-matched output sequence, which can improve HARQ performance of the polar code.

Optionally, in another embodiment, when determining, based on the first group of interleaved bits and the second group of interleaved bits, the rate-matched output sequence, the rate matching apparatus 820 may sequentially combine the first group of interleaved bits (Set1) and the second group of interleaved bits (Set2) into a third group of interleaved bits (Set3), that is, in Set3, all bits in Set1 are located before all bits in Set2. Then bits may be sequentially intercepted or repeatedly extracted from Set3 to obtain the rate-matched output sequence required for each time of retransmission. For example, when a length La of bits that need to be retransmitted is shorter than a length Lb of Set3, some bits whose length is La may be intercepted from Set3 as the rate-matched output sequence. For another example, when a length La of bits that need to be retransmitted is longer than a length Lb of Set3, after all bits in Set3 are read, the bits in Set3 may be read again from the beginning, which is repeated until the rate-matched output sequence whose length is La is read.

In an HARQ process of a polar code, system bits and parity check bits are of different importance, and specifically, the system bits are more important than the parity check bits. Therefore, a first group of interleaved bits Set1 obtained by interleaving the system bits is placed before a second group of interleaved bits Set2 obtained by interleaving the parity check bits, so that the first group of interleaved bits Set1 and the second group of interleaved bits Set2 are combined into a third group of interleaved bits Set3, and in this way, more system bits can be reserved in a rate-matched output sequence that is finally obtained, thereby improving HARQ performance of the polar code.

Optionally, in another embodiment, when determining, based on the interleaved bits, the rate-matched output sequence, the rate matching apparatus 820 may write the interleaved bits into a circular buffer, determine a start location of the rate-matched output sequence in the circular buffer according to a redundancy version, and read the rate-matched output sequence from the circular buffer according to the start location.

Optionally, in another embodiment, when determining, based on the interleaved bits, the rate-matched output sequence, the rate matching apparatus 820 may sequentially intercept or repeatedly extract bits from the interleaved bits to obtain the rate-matched output sequence required for each time of retransmission.

In addition, in the system 800, a modulator 822 may multiplex a frame, so that the transmitter 824 sends information to the access terminal 804 by using the antenna 808. Although it is shown that the polar code encoder 818, the rate matching apparatus 820, and/or the modulator 822 is separated from the processor 814, it may be understood that the polar code encoder 818, the rate matching apparatus 820, and/or the modulator 822 may be a part of the processor 814 or multiple processors (which are not shown).

It may be understood that the embodiments described in this specification may be implemented by hardware, software, firmware, middleware, microcode, or a combination thereof. For implementation by hardware, a processing unit may be implemented in one or more ASICs (Application Specific Integrated Circuits, application specific integrated circuits), DSPs (Digital Signal Processing, digital signal processors), DSPDs (DSP Device, digital signal processing devices) PLDs (Programmable Logic Device, programmable logic devices), FPGAs (Field-Programmable Gate Array, field-programmable gate arrays), processors, controllers, micro-controllers, microprocessors, other electronic units used for performing the functions in this application, or a combination thereof.

When the embodiments are implemented in software, firmware, middleware, microcode, program code, or a code segment, the software, the firmware, the middleware, the microcode, the program code, or the code segment may be stored in, for example, a machine-readable medium of a storage component. The code segment may indicate a process, a function, a subprogram, a program, a routine, a subroutine, a module, a software group, a class, or any combination of an instruction, a data structure, or a program statement. The code segment may be coupled to another code segment or a hardware circuit by transferring and/or receiving information, data, an independent variable, a parameter, or memory content. The information, the independent variable, the parameter, the data, or the like may be transferred, forwarded, or sent in any appropriate manner such as memory sharing, message transfer, token transfer, or network transmission.

For implementation by software, the technologies in this specification may be implemented by using modules (for example, a process and a function) for executing the functions in this specification. Software code may be stored in a memory unit and executed by a processor. The memory unit may be implemented inside the processor or outside the processor, and in a latter case, the memory unit may be coupled to the processor by means of communication by using various means known in the art.

Figure 9:
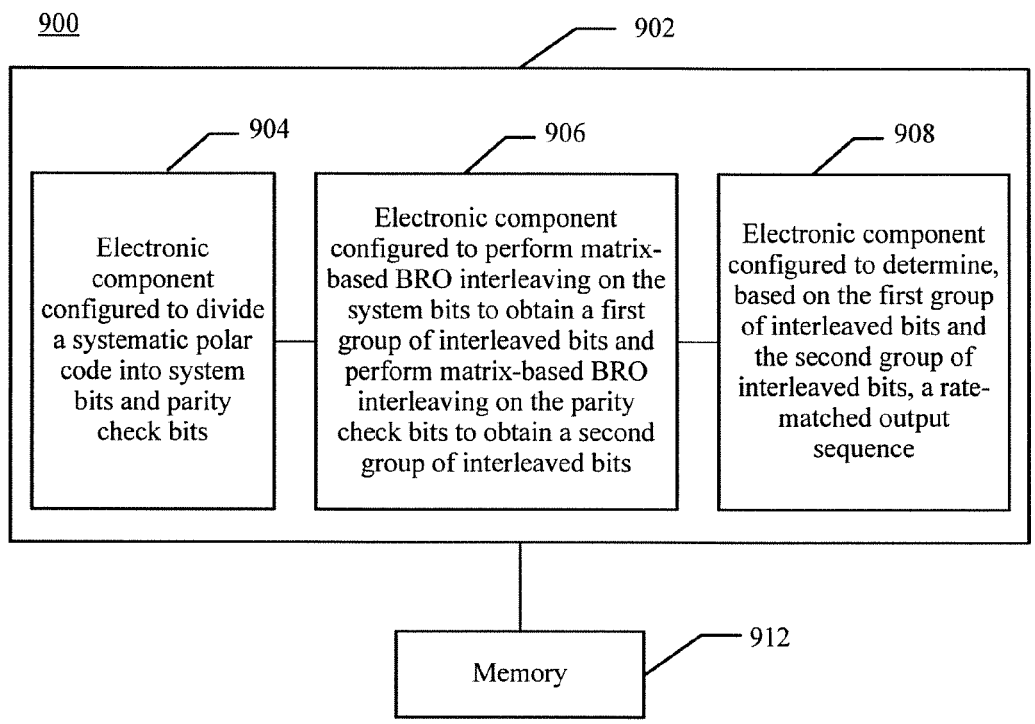
FIG. 9 shows a system in which a polar code rate matching method can be used in a wireless communications environment.

Referring to FIG. 9, FIG. 9 shows a system 900 in which a polar code rate matching method can be used in a wireless communications environment. For example, the system 900 may at least partially reside in a base station. According to another example, the system 900 may at least partially reside in an access terminal. It should be understood that the system 900 may be represented as including a functional block, which may be a functional block representing a function implemented by a processor, software, or a combination thereof (for example, firmware). The system 900 includes a logic group 902 having electronic components that jointly perform an operation.

For example, the logic group 902 may include an electronic component 904 that is configured to divide a systematic polar code into system bits and parity check bits, and an electronic component 906 that is configured to perform matrix-based BRO interleaving on the system bits to obtain a first group of interleaved bits and perform matrix-based BRO interleaving on the parity check bits to obtain a second group of interleaved bits. The logic group 902 may further include an electronic component 908 that is configured to determine, based on the first group of interleaved bits and the second group of interleaved bits, a rate-matched output sequence.

According to this embodiment of the present invention, system bits and parity check bits are separately interleaved, to obtain a rate-matched output sequence, so that a sequence structure after interleaving is more random, which can reduce an FER, thereby improving HARQ performance and ensuring reliability of data transmission.

In addition, because impacts of interleaving processing on minimum distances of the system bits and the parity check bits are different, when the system bits and the parity check bits are separately interleaved, a minimum distance of interleaved bits can be further increased, thereby improving rate matching performance of a polar code.

In addition, the system 900 may include a memory 912. The memory 912 stores instructions used for performing functions related to the electronic components 904, 906, and 908. Although it is shown that the electronic components 904, 906, and 908 are outside the memory 912, it may be understood that one or more of the electronic components 904, 906, and 908 may exist inside the memory 912.

Figure 10:
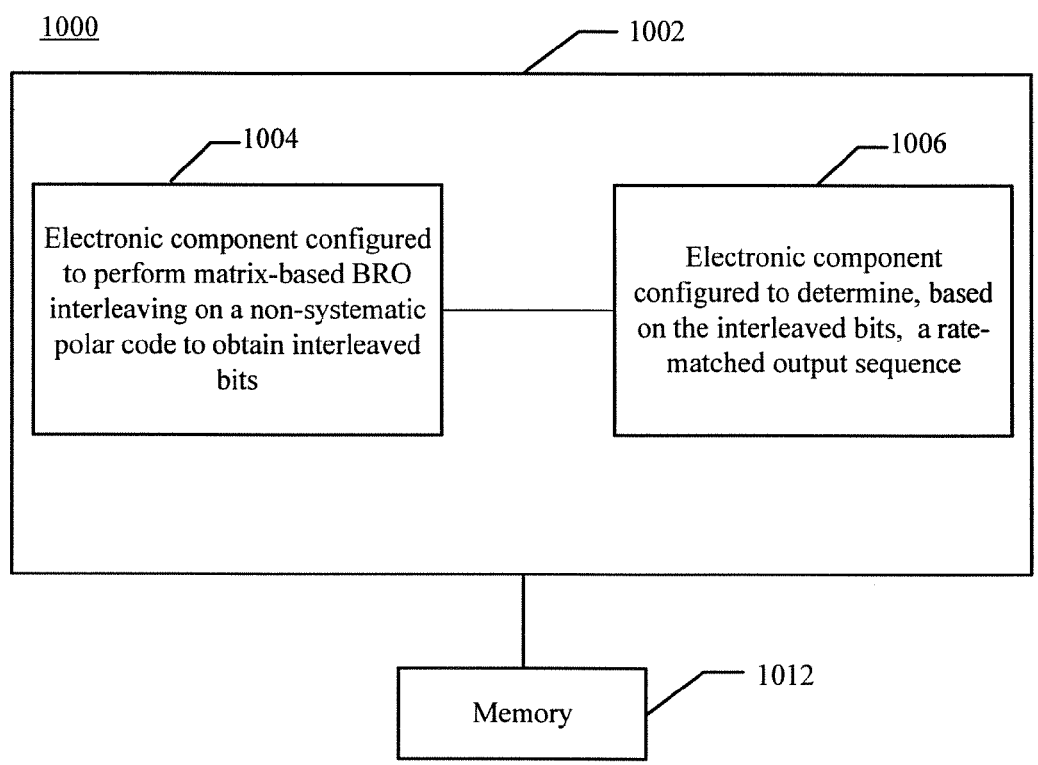
FIG. 10 shows a system in which a polar code rate matching method can be used in a wireless communications environment.

Referring to FIG. 10, FIG. 10 shows a system 1000 in which a polar code rate matching method can be used in a wireless communications environment. For example, the system 1000 may at least partially reside in a base station. According to another example, the system 1000 may at least partially reside in an access terminal. It should be understood that the system 1000 may be represented as including a functional block, which may be a functional block representing a function implemented by a processor, software, or a combination thereof (for example, firmware). The system 1000 includes a logic group 1002 having electronic components that jointly perform an operation.

For example, the logic group 1002 may include an electronic component 1004 that is configured to perform matrix-based BRO interleaving on a non-systematic polar code entirely to obtain interleaved bits, and an electronic component 1006 that is configured to determine, based on the interleaved bits, a rate-matched output sequence.

According to this embodiment of the present invention, matrix-based BRO interleaving is performed on a non-systematic polar code entirely, so that a minimum distance of interleaved bits is increased, thereby improving rate matching performance of the polar code.

In addition, the system 1000 may include a memory 1012. The memory 1012 stores instructions used for performing functions related to the electronic components 1004, 1006, and 1008. Although it is shown that the electronic components 1004, 1006, and 1008 are outside the memory 1012, it may be understood that one or more of the electronic components 1004, 1006, and 1008 may exist inside the memory 1012.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and no further details are provided herein.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one location, or may be distributed on multiple network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code rate matching method, comprising:
performing, by a rate matching apparatus, matrix-based bit reversal order (BRO) interleaving on a non-systematic polar code output by a polar code encoder, to obtain interleaved bits;
determining, by the rate matching apparatus, based on the interleaved bits, a rate-matched output sequence;
transmitting, by the rate matching apparatus, the rate-matched output sequence;
wherein performing matrix-based BRO interleaving on the non-systematic polar code output by the polar code encoder, to obtain interleaved bits comprises:
writing, by the rate matching apparatus, bits of the non-systematic polar code by row, to form a first matrix of M1 rows×M2 columns, wherein M1 and M2 are positive integers;
performing, by the rate matching apparatus, a first substitution operation on a column of the first matrix to obtain a second matrix, wherein the first substitution operation is a BRO operation with a size of M2;
performing, by the rate matching apparatus, a second substitution operation on a row of the second matrix to obtain a third matrix, wherein the second substitution operation is a BRO operation with a size of M1;
reading, by the rate matching apparatus, bits according to a column of the third matrix, and using the bits as the interleaved bits;
or
writing, by the rate matching apparatus, bits of the non-systematic polar code by column to form a first matrix of M1 rows×M2 columns, wherein M1 and M2 are positive integers;
performing, by the rate matching apparatus, a first substitution operation on a column of the first matrix to obtain a second matrix, wherein the first substitution operation is a BRO operation with a size of M2;
performing, by the rate matching apparatus, a second substitution operation on a row of the second matrix to obtain a third matrix, wherein the second substitution operation is a BRO operation with a size of M1; and
reading, by the rate matching apparatus, bits, according to a row of the third matrix, and using the bits as the interleaved bits.

2. A polar code rate matching method, comprising:
dividing, by a rate matching apparatus, a systematic polar code output by a polar code encoder into system bits and parity check bits;
performing, by the rate matching apparatus, matrix-based bit reversal order (BRO) interleaving on the system bits to obtain a first group of interleaved bits;
performing, by the rate matching apparatus, matrix-based BRO interleaving on the parity check bits to obtain a second group of interleaved bits;
determining, by the rate matching apparatus, based on the first group of interleaved bits and the second group of interleaved bits, a rate-matched output sequence;
wherein performing matrix-based BRO interleaving on the system bits to obtain a first group of interleaved bits comprises:
writing, by the rate matching apparatus, the system bits by row to form a first matrix of M1 rows×M2 columns;
performing, by the rate matching apparatus, a first substitution operation on a column of the first matrix to obtain a second matrix, wherein the first substitution operation is a BRO operation with a size of M2;
performing, by the rate matching apparatus, a second substitution operation on a row of the second matrix to obtain a third matrix, wherein the second substitution operation is a BRO operation with a size of M1, and
reading, by the rate matching apparatus, bits according to a column of the third matrix, and using, by the rate matching apparatus, the bits as the first group of interleaved bits, wherein M1 and M2 are positive integers;
or
writing, by the rate matching apparatus, the system bits by column to form a first matrix of M1 rows×M2 columns;

performing, by the rate matching apparatus, a first substitution operation on a column of the first matrix to obtain a second matrix, wherein the first substitution operation is a BRO operation with a size of M2;

performing, by the rate matching apparatus, a second substitution operation on a row of the second matrix to obtain a third matrix, wherein the second substitution operation is a BRO operation with a size of M1;

reading, by the rate matching apparatus, bits according to a row of the third matrix; and using, by the rate matching apparatus, the bits as the first group of interleaved bits, wherein M1 and M2 are positive integers.

3. The method according to claim 2, wherein performing matrix-based BRO interleaving on the parity check bits to obtain a second group of interleaved bits comprises:

writing, by the rate matching apparatus, the parity check bits by row to form a first matrix of M1 rows×M2 columns;

performing, by the rate matching apparatus, a first substitution operation on a column of the first matrix to obtain a second matrix, wherein the first substitution operation is a BRO operation with a size of M2;

performing, by the rate matching apparatus, a second substitution operation on a row of the second matrix to obtain a third matrix, wherein the second substitution operation is a BRO operation with a size of M1;

reading, by the rate matching apparatus, bits according to a column of the third matrix, and using the bits as the second group of interleaved bits, wherein M1 and M2 are positive integers; or writing, by the rate matching apparatus, the parity check bits by column to form a first matrix of M1 rows×M2 columns;

performing, by the rate matching apparatus, a first substitution operation on a column of the first matrix to obtain a second matrix, wherein the first substitution operation is a BRO operation with a size of M2;

performing, by the rate matching apparatus, a second substitution operation on a row of the second matrix to obtain a third matrix, wherein the second substitution operation is a BRO operation with a size of M1; and reading, by the rate matching apparatus, bits according to a row of the third matrix, and using the bits as the second group of interleaved bits, wherein M1 and M2 are positive integers.

4. A polar code rate matching apparatus, comprising:

a non-transitory memory configured to store instructions; and a processor coupled to the memory and configured to execute the instructions stored in the memory to cause the apparatus to:

perform matrix-based bit reversal order (BRO) interleaving on a non-systematic polar code output by a polar code encoder, to obtain interleaved bits, determine, based on the interleaved bits, a rate-matched output sequence, write bits of the non-systematic polar code by row to form a first matrix of M1 rows×M2 columns, wherein M1 and M2 are positive integers, perform a first substitution operation on a column of the first matrix to obtain a second matrix, wherein the first substitution operation is a BRO operation of M2 bits, perform a second substitution operation on a row of the second matrix to obtain a third matrix, wherein the second substitution operation is a BRO operation of M1 bits, and read bits according to a column of the third matrix; or write bits of the non-systematic polar code by column to faun a first matrix of M1 rows×M2 columns, wherein M1 and M2 are positive integers, perform a first substitution operation on a column of the first matrix to obtain a second matrix, wherein the first substitution operation is a BRO operation of M2 bits, perform a second substitution operation on a row of the second matrix to obtain a third matrix, wherein the second substitution operation is a BRO operation of M1 bits, and read bits according to a row of the third matrix.

5. A rate matching apparatus, comprising:

a non-transitory memory configured to store instructions; and a processor coupled to the memory and configured to execute the instructions stored in the memory to cause the apparatus to:

divide a systematic polar code output by a polar code encoder into system bits and parity check bits, perform matrix-based bit reversal order (BRO) interleaving on the system bits to obtain a first group of interleaved bits, and perform matrix-based BRO interleaving on the parity check bits to obtain a second group of interleaved bits, determine, based on the first group of interleaved bits and the second group of interleaved bits, a rate-matched output sequence, write to-be-interleaved bits by row to form a first matrix of M1 rows×M2 columns, wherein M1 and M2 are positive integers, perform a first substitution operation on a column of the first matrix to obtain a second matrix, wherein the first substitution operation is a BRO operation of M2 bits, perform a second substitution operation on a row of the second matrix to obtain a third matrix, wherein the second substitution operation is a BRO operation of M1 bits, and read bits according to a column of the third matrix; or write to-be-interleaved bits by column to form a first matrix of M1 rows×M2 columns, wherein M1 and M2 are positive integers, perform a first substitution operation on a column of the first matrix to obtain a second matrix, wherein the first substitution operation is a BRO operation of M2 bits, perform a second substitution on a row of the second matrix to obtain a third matrix, wherein the second substitution operation is a BRO operation of M1 bits, and read bits according to a row of the third matrix.

* * * * *